United States Patent
Sun et al.

(10) Patent No.: US 12,167,666 B2
(45) Date of Patent: Dec. 10, 2024

(54) DISPLAY PANEL WITH LENS LAYER AND ELECTRONIC DEVICE INCLUDING SAME

(71) Applicant: WUHAN CHINA STAR OPTOELECTRONICS SEMICONDUCTOR DISPLAY TECHNOLOGY CO., LTD., Hubei (CN)

(72) Inventors: Liang Sun, Hubei (CN); He Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/597,169

(22) PCT Filed: Dec. 21, 2021

(86) PCT No.: PCT/CN2021/140124
§ 371 (c)(1),
(2) Date: Dec. 28, 2021

(87) PCT Pub. No.: WO2023/108724
PCT Pub. Date: Jun. 22, 2023

(65) Prior Publication Data
US 2024/0032398 A1 Jan. 25, 2024

(30) Foreign Application Priority Data
Dec. 13, 2021 (CN) ......................... 202111514881.5

(51) Int. Cl.
*H10K 59/80* (2023.01)
*H10K 102/00* (2023.01)

(52) U.S. Cl.
CPC ...... *H10K 59/879* (2023.02); *H10K 2102/331* (2023.02); *H10K 2102/351* (2023.02)

(58) Field of Classification Search
CPC ...... H10K 59/879; H10K 59/50; H10K 50/858
See application file for complete search history.

(56) References Cited

U.S. PATENT DOCUMENTS

2014/0043681 A1* 2/2014 Ishii ................. G02B 30/27
977/773
2015/0048333 A1 2/2015 Choi et al.
(Continued)

FOREIGN PATENT DOCUMENTS

| CN | 112382648 A | 2/2021 |
| CN | 112670431 A | 4/2021 |

(Continued)

OTHER PUBLICATIONS

International Search Report in International application No. PCT/CN2021/140124, mailed on May 30, 2022.
(Continued)

*Primary Examiner* — Nduka E Ojeh

(57) ABSTRACT

A display panel and an electronic device are provided. The electronic device includes a display panel. The display panel includes a light-emitting component layer, a flat layer, and a lens layer. The lens layer has a plurality of lens units. A refractive index of the lens layer is greater than a refractive index of the flat layer, so that a refractive index difference between the lens layer and the flat layer and refractive effect of the lens units on the light are used to reduce angles of light emission, such that light at large angles converges and transmits toward a center, thereby improving efficiency of forward light emission of the display panel.

20 Claims, 8 Drawing Sheets

(56) References Cited

U.S. PATENT DOCUMENTS

| | | | |
|---|---|---|---|
| 2019/0115404 A1* | 4/2019 | Moon | H10K 50/82 |
| 2019/0165053 A1* | 5/2019 | Park | H10K 50/81 |
| 2019/0221779 A1* | 7/2019 | Jang | H10K 59/122 |
| 2020/0350517 A1 | 11/2020 | Bae et al. | |
| 2020/0358035 A1 | 11/2020 | Yokoyama et al. | |

FOREIGN PATENT DOCUMENTS

| | | |
|---|---|---|
| CN | 113054136 A | 6/2021 |
| CN | 113480951 A | 10/2021 |
| CN | 113554938 A | 10/2021 |
| CN | 113568080 A | 10/2021 |
| CN | 113629206 A | 11/2021 |

OTHER PUBLICATIONS

Written Opinion of the International Search Authority in International application No. PCT/CN2021/140124, mailed on May 30, 2022.

Chinese Office Action issued in corresponding Chinese Patent Application No. 202111514881.5 dated Dec. 8, 2022, pp. 1-7.

\* cited by examiner

DISPLAY PANEL WITH LENS LAYER AND ELECTRONIC DEVICE INCLUDING SAME

FIELD OF INVENTION

The present disclosure relates to a field of display technologies, and more particularly to a display panel and an electronic device.

BACKGROUND OF DISCLOSURE

With the development of consumer electronics, organic light-emitting diode (OLED) electronic devices, which have many advantages such as thin bodies, self-luminating, wide viewing angle, energy saving and environmental protection, have been widely used in various fields.

SUMMARY OF INVENTION

Technical Problem

Currently, an organic light-emitting diode display panel is combined by a variety of film layers and light-emitting layers, such as substrates of glass or polyimide and light-emitting component layers. When light is emitted from a light-emitting components layer, there are large amount of light at large angles. Influenced by factors such as reflection and refraction, most of the light is emitted at large angles or cannot escape into the air due to total reflection on the surface of the light-emitting components, thereby decreasing the forward light emission and transmittance of the light, so that the efficiency of display light is decreased, and the power consumption is increased.

From the above discussion, the existing display panel has the problem of low efficiency of forward light emission. Therefore, it is necessary to provide a display panel and an electronic device to improve this defect.

Technical Solutions

Embodiments of the present application provide a display panel and an electronic device in order to solve the problem of low efficiency of forward light emission existed in the existing display panel.

Embodiments of the present application provide a display panel, comprising:
- a light-emitting component layer having a plurality of light-emitting components;
- a flat layer disposed on a light emission side of the light-emitting component layer, wherein a plurality of recesses aligned with the light-emitting components are defined by the flat layer, and the recesses penetrate through the flat layer in a thickness direction of the flat layer; and
- a lens layer having a plurality of lens units, wherein the lens units are disposed in the recesses,
- wherein a refractive index of the lens layer is greater than a refractive index of the flat layer.

According to an embodiment of the present application, the lens layer fills the recesses and covers a side of the flat layer away from the light-emitting component layer.

According to an embodiment of the present application, a thickness of the flat layer is greater than or equal to 1 µm and less than or equal to 5 µm, and a thickness of the lens layer is greater than or equal to 10 µm and less than or equal to 50 µm.

According to an embodiment of the present application, material of the lens layer comprises optical adhesive and refractive particles distributed over the optical adhesive.

According to an embodiment of the present application, the refractive index of the flat layer is greater than or equal to 1.1 and less than or equal to 1.4, and the refractive index of the lens layer is greater than or equal to 1.5 and less than or equal to 2.

According to an embodiment of the present application, a mass ratio of the refractive particles in the material of the lens layer is greater than or equal to 1% and less than or equal to 40%.

According to an embodiment of the present application, the recess is defined by a bottom surface flatly disposed and a sidewall inclinedly disposed, and an angle between the sidewall and a plane where the bottom surface locates is greater than or equal to 30° and less than or equal to 75°.

According to an embodiment of the present application, an orthographic projection of the bottom surface of the recess projected in a thickness direction of the display panel covers an orthographic projection of a light-emitting surface of the light-emitting component projected in the thickness direction of the display panel.

According to an embodiment of the present application, wherein a distance between the bottom surface of the recess and the light-emitting surface of corresponding one of the light-emitting components is h;
- a minimum distance between an outer edge of the orthographic projection of the bottom surface of the recess projected in the thickness direction of the display panel and an outer edge of the light-emitting surface of the light-emitting component in the thickness direction of the display panel is b;
- wherein b=h*n, and n is greater than or equal to 0 and less than or equal to 0.2.

Embodiments of the present application further provide an electronic device comprising a display panel, wherein the display panel comprises:
- a light-emitting component layer having a plurality of light-emitting components;
- a flat layer disposed on a light emission side of the light-emitting component layer, wherein a plurality of recesses aligned with the light-emitting components are defined by the flat layer, and the recesses penetrate through the flat layer in a thickness direction of the flat layer; and
- a lens layer having a plurality of lens units, wherein the lens units are disposed in the recesses,
- wherein a refractive index of the lens layer is greater than a refractive index of the flat layer.

According to an embodiment of the present application, the lens layer fills the recesses and covers a side of the flat layer away from the light-emitting component layer.

According to an embodiment of the present application, a thickness of the flat layer is greater than or equal to 1 µm and less than or equal to 5 µm, and a thickness of the lens layer is greater than or equal to 10 µm and less than or equal to 50 µm.

According to an embodiment of the present application, material of the lens layer comprises optical adhesive and refractive particles distributed over the optical adhesive.

According to an embodiment of the present application, the refractive index of the flat layer is greater than or equal to 1.1 and less than or equal to 1.4, and the refractive index of the lens layer is greater than or equal to 1.5 and less than or equal to 2.

According to an embodiment of the present application, a mass ratio of the refractive particles in the material of the lens layer is greater than or equal to 1% and less than or equal to 40%.

According to an embodiment of the present application, the recess is defined by a bottom surface flatly disposed and a sidewall inclinedly disposed, and an angle between the sidewall and a plane where the bottom surface locates is greater than or equal to 30° and less than or equal to 75°.

According to an embodiment of the present application, an orthographic projection of the bottom surface of the recess projected in a thickness direction of the display panel covers an orthographic projection of a light-emitting surface of the light-emitting component projected in the thickness direction of the display panel.

According to an embodiment of the present application, wherein a distance between the bottom surface of the recess and the light-emitting surface of corresponding one of the light-emitting components is h;

a minimum distance between an outer edge of the orthographic projection of the bottom surface of the recess projected in the thickness direction of the display panel and an outer edge of the light-emitting surface of the light-emitting component in the thickness direction of the display panel is b;

wherein $b=h*n$, and n is greater than or equal to 0 and less than or equal to 0.2.

Beneficial Effects

The beneficial effects of the embodiments of the present disclosure are as follows: the embodiments of the present application provide a display panel and an electronic device. The electronic device includes the display panel. The display panel includes a light-emitting component layer, a flat layer, and a lens layer. The light-emitting component layer has a plurality of light-emitting components. The flat layer is disposed on a light emission side of the light-emitting component layer. A plurality of recesses aligned with the light-emitting components are defined by the flat layer. The recesses penetrate through the flat layer in a thickness direction of the flat layer. The lens layer has a plurality of lens units. The lens units are disposed in the recesses. A refractive index of the lens layer is greater than a refractive index of the flat layer. As a result, a refractive index difference between the lens layer and the flat layer and refractive effect of the lens units on the light are used to reduce angles of light emission, such that light at large angles converges and transmits toward a center, thereby improving efficiency of forward light emission of the display panel.

BRIEF DESCRIPTION OF DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making creative efforts.

DETAILED DESCRIPTION OF PREFERRED EMBODIMENTS

Figure 1:
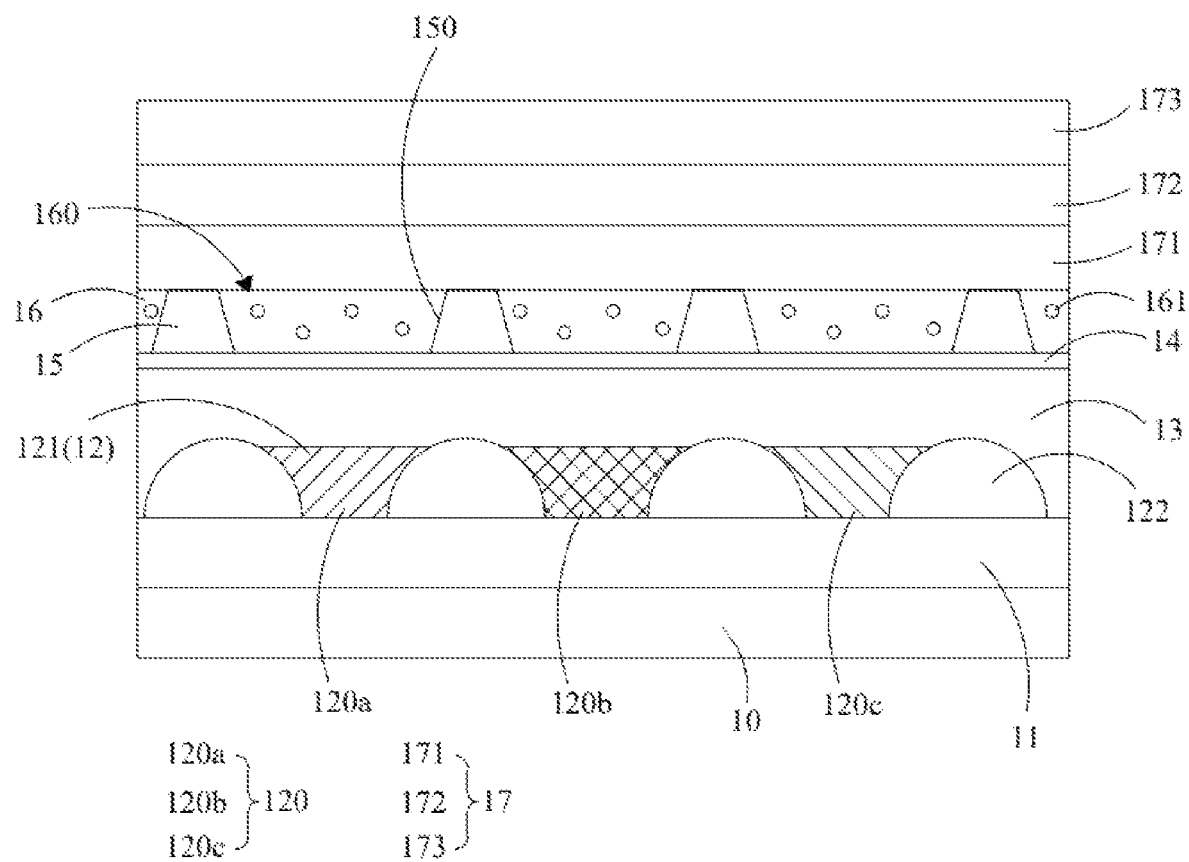
FIG. 1 is a schematic diagram of the structure of a first type of display panel provided in an embodiment of the present application.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

The present disclosure is further described below in connection with the accompanying drawings and specific embodiments.

Embodiments of the present application provide a display panel and an electronic device. The electronic device includes the display panel. The electronic device can be a mobile terminal, such as a smartphone, a tablet computer, a notebook computer, etc., the electronic device can also be a wearable terminal, such as a smart watch, a smart bracelet, smart glasses, an augmented reality device, etc., and the electronic device may also be a fixed terminal, such as a desktop computer, a television, etc.

As shown in FIG. 1, which is a schematic diagram of the structure of a first type of display panel provided in an embodiment of the present application, the display panel includes a base substrate 10 and a thin film transistor array layer 11 and a light-emitting component layer 12 sequentially stacked on the base substrate 10.

The thin film transistor array layer 11 has a plurality of pixel driving circuits distributed in an array and data lines and scan lines used for connecting pixel driving circuits. The pixel driving circuits are consisted of a plurality of thin film transistors and capacitors.

The light-emitting component layer 12 includes a plurality of light-emitting components 120. The light-emitting components 120 are electrically connected with the pixel driving circuits, thereby emitting light under control and driving of the pixel driving circuits.

In an embodiment of the present application, the light-emitting components 120 are organic light-emitting diodes. The light-emitting components 120 include red organic light-emitting diodes 120a, green organic light-emitting diodes 120b, and blue organic light-emitting diodes 120c. The red organic light-emitting diodes 120a, the green organic light-emitting diodes 120*b*, and the blue organic light-emitting diodes 120*c* are spaced apart from each other.

In practical applications, the type of the light-emitting components 120 is not limited to the organic light-emitting diode in the above-mentioned embodiments but can also be a micro light-emitting diode (Micro LED) chip or a mini light-emitting diode (Mini LED).

The light-emitting component layer 12 includes a pixel definition layer 122. The pixel definition layer 122 is disposed on a side of the thin film transistor array layer 11 away from the base substrate 10. A plurality of pixel openings are defined by the pixel definition layer 122. The pixel openings penetrate through the pixel definition layer 122 in a thickness direction of the pixel definition layer 122. The light-emitting components 120 include a light-emitting layer 121. The light-emitting layer 121 is disposed in the pixel openings on the pixel definition layer 122.

Furthermore, as shown in FIG. 1, the display panel further includes an encapsulation layer 13. The encapsulation layer 13 is disposed on a light emission side of the light-emitting component layer 12 and covers the light-emitting component layer 12 in order to prevent water vapor and oxygen of the external environment from invading the light-emitting component layer 12 and the thin film transistor array layer 11.

In the embodiments of the present application, the encapsulation layer 13 can be prepared and formed by a thin-film encapsulation (TFE) process. The encapsulation layer 13 can include a first inorganic encapsulation layer, an organic encapsulation layer, and a second inorganic encapsulation layer sequentially stacked on a light emission side of the light-emitting component layer 12.

The materials of the first inorganic encapsulation layer and the second inorganic layer can include at least one or more inorganic materials such as silicon nitride, silicon oxide, and silicon oxynitride with better hydrophobicity. The materials of the organic encapsulation layer can include at least one or more materials such as epoxy resin or acrylic-based materials.

The display panel further includes a touch control layer 14. The touch control layer 14 is disposed on a side of the encapsulation layer 13 away from the light-emitting component layer 12.

In addition, the display panel further includes a flat layer 15. The flat layer 15 is disposed on a light emission side of the light-emitting component layer 12. A plurality of recesses 150 aligned with the light-emitting components 120 are defined by the flat layer 15.

As shown in FIG. 1, the flat layer 15 is disposed on a side of the touch control layer 14 away from the encapsulation layer 13. A plurality of recesses 150 arranged at intervals are defined by the flat layer 15. The recesses 150 penetrate through the flat layer 15 in a thickness direction of the flat layer 15. The recesses 150 and the light-emitting components 120 are one-to-one aligned with each other, so that light emitted by the light-emitting components 120 can be emitted through the recesses 150.

In embodiments of the present application, the recesses 150 are inverted trapezoids in a cross-section perpendicular to the flat layer 15. In practical applications, the shape of the recesses 150 in the cross-section perpendicular to the flat layer 15 is not limited to an inverted trapezoid in the above-mentioned embodiments but can also include but not limited to any one of trapezoids, rectangles, semi-circles, semi-ellipses, and other irregular shapes.

Furthermore, the display panel further includes a lens layer 16. The lens layer 16 has a plurality of lens units 160. The lens units 160 are disposed in the recesses. A refractive index of the lens layer 16 is greater than a refractive index of the flat layer 15.

As shown in FIG. 1, the materials of the lens layer 16 are respectively filled within each of the recesses 150 so as to form a plurality of lens units 160 arranged at intervals. The lens units 160 are in shape of prisms.

Furthermore, as shown in FIG. 1, material of the lens layer 16 includes optical adhesive and refractive particles 161 distributed over the optical adhesive. A refractive index of the refractive particles 161 is greater than a refractive index of the optical adhesive. Through adding refractive particles into optical adhesive, the refractive index of the optical adhesive can be increased, such that the refractive index of the lens layer 16 can be greater than the refractive index of the flat layer 15.

In embodiments of the present application, the refractive index of the flat layer 15 is greater than or equal to 1.1 and less than or equal to 1.4. The refractive index of the flat layer 15 can specifically be 1.1, 1.2, 1.3, or 1.4, etc. A thickness of the flat layer 15 is greater than or equal to 1 μm and less than or equal to 5 μm. The thickness of the flat layer 15 can specifically be 1 μm, 2 μm, 4 μm, or 5 μm, etc.

In embodiments of the present application, the refractive index of the optical adhesive can be greater than or equal to 1.4 and less than or equal to 1.7. The refractive index of the refractive particles 161 is greater than 1.8. The refractive index of the lens layer 16 formed by mixing the refractive particles 161 with the optical adhesive is greater than or equal to 1.5 and less than or equal to 2. The refractive index of the lens layer 16 can specifically be 1.5, 1.7, 1.9, or 2, etc.

Specifically in embodiments of the present application, the refractive particles 161 can be zirconia particles. In practical applications, the material of the refractive particles is not limited to the zirconia in the above-mentioned embodiment but can also include but not limited to particles formed by the preparation of at least one or more of nanoscale organic silicone materials, $SiN_x$, $Si_3N_4$, $TiO_2$, MgO, ZnO, $SnO_2$, $Al_2O_3$, and $CaF_2$.

In embodiments of the present application, particle sizes of the refractive particles 161 should be greater than or equal to 5 nm and less than or equal to 50 nm. The particle sizes of the refractive particles can specifically be 5 nm, 10 nm, 30 nm, 45 nm, or 50 nm, etc. The particle sizes of the refractive particles 161 should be less than the thickness of the lens layer 16, so that the refractive particles 161 can be evenly distributed over the lens layer 16.

In one embodiment, the lens layer 16 fills the recesses 150 and covers a side of the flat layer 15 away from the light-emitting component layer 12.

Figure 2:
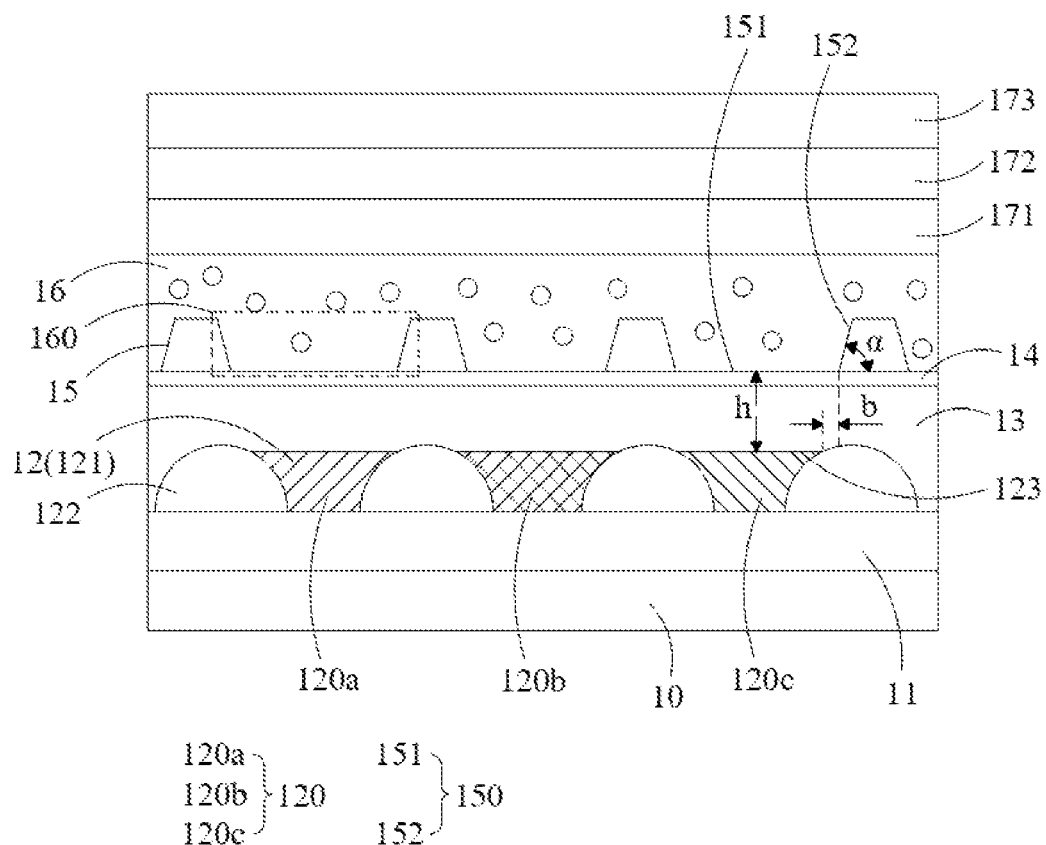
FIG. 2 is a schematic diagram of the structure of a second type of display panel provided in an embodiment of the present application.

As shown in FIG. 2, which is a schematic diagram of the structure of a second type of display panel provided in an embodiment of the present application, the structure of the second type of display panel shown in FIG. 2 is substantially similar to the structure of the first type of display panel shown in FIG. 1. What is different is the lens layer 16 of the second type of display panel shown in FIG. 2 not only fills the recesses 150, but also covers the side of the flat layer 15 away from the light-emitting component layer 12, i.e., the thickness of the lens layer 16 is greater than the thickness of the flat layer 15.

Figure 3:
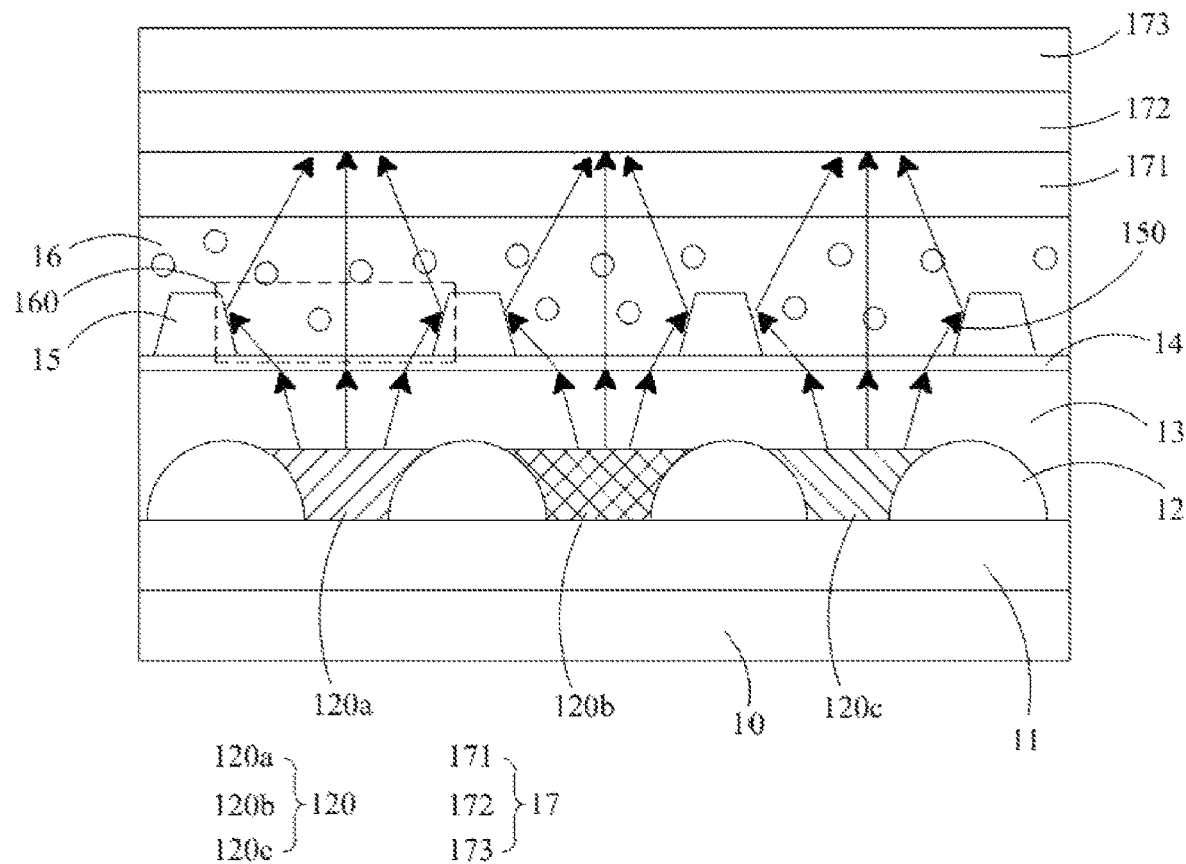
FIG. 3 is a schematic diagram of an optical path of the second type of display panel provided in an embodiment of the present application.

As shown in FIG. 3. FIG. 3 is a schematic diagram of an optical path of the second type of display panel provided in an embodiment of the present application. The direction indicated by the arrow in FIG. 3 is a transmitting direction of light emitted by the light-emitting layer 121. Since the refractive index of the lens layer 16 is greater than the refractive index of the flat layer 15, when the light emitted by the light-emitting layer 121 is transmitted to the interface of the lens units 160 and the flat layer 15 through the inside of the lens units 160, a total reflection can be occurred, such that angles of light emission become smaller and the light exits through the light emission surface of the lens units 160 again, so that the lens layer 16 can be used to converge light at large angles emitted from the light-emitting layer 121 toward a center, and the loss caused by the total reflection of light at large angles occurred between the other film layers can be reduced, thereby improving efficiency of forward light emission of the display panel.

Compared with the first type of display panel shown in FIG. 1, in the second type of display panel shown in FIG. 2, the part of the lens layer 16 beyond the flat layer 15 is also composed of optical adhesive and refractive particles 161 distributed in the optical adhesive, so that the part of the lens layer 16 beyond the flat layer 15 can diffuse light, so that efficiency of light emission of the display panel can be further enhanced.

In addition, taking the second type of display panel shown in FIG. 2 as an example, the cross-sectional shape of the recess 150 is an inverted trapezoid. The recess 150 is defined by a bottom surface 151 flatly disposed and a sidewall 152 inclinedly disposed, and an angle α is formed between the sidewall and a plane where the bottom surface locates. The angle α should be greater than or equal to 30° and less than or equal to 75°. It should be noted that the sidewall 152 of the recess 150 is set as an inclined sidewall, so that a total reflection of the light is occurred at the interface of the lens unit 160 and the sidewall 152 of the recess 150, such that the light at large angles entered the lens layer 16 is converged toward the center, thereby increasing efficiency of light emission of the display panel.

In practical applications, the degree of the angle α can be 30°, 40°, 50°, 60°, 70°, or 75°, etc., which is only needed to be greater than or equal to 30° and less than or equal to 75°.

Further, an orthographic projection of the bottom surface 151 of the recess 150 projected in a thickness direction of the display panel covers an orthographic projection of the light-emitting component 120 projected in the thickness direction of the display panel.

It should be noted that part of the light emitted from a light-emitting surface 123 of the light-emitting components 120 is diffused outwardly at large angles after passing through the encapsulation layer 13, and by limiting the orthographic projection of the bottom surface 151 of the recess 150 in the thickness direction of the display panel to cover the orthographic projection of the light-emitting component 120 in the thickness direction of the display panel, a size of the bottom surface of the recess 150 can be greater than or equal to a size of the light-emitting surface 123 of the light-emitting component 120, so that more light can enter the recess 150 without being blocked by the flat layer 15 around the recess 150 which is not removed by etching, and thus the transmittance of the light in the flat layer 15 can be increased.

As shown in FIG. 2, a distance between the bottom surface 151 of the recess 150 and the light-emitting surface 123 of corresponding one of the light-emitting components 120 is h, and a minimum distance between an outer edge of the orthographic projection of the bottom surface 151 of the recess 150 projected in the thickness direction of the display panel and an outer edge of the light-emitting surface 123 of the light-emitting component 120 in the thickness direction of the display panel is b, in which b=h*n, and n is greater than or equal to 0 and less than or equal to 0.2.

In the second type of display panel shown in FIG. 2, since the encapsulation layer 13 and the touch control layer 14 are disposed between the flat layer 15 and the light-emitting component layer 12, the encapsulation layer 13 will diffuse the light. In order to make light at large angles emitted from the encapsulation layer 13 can enter the recess 150, it is needed to make the size of the bottom surface of the recess 150 be greater than the size of the light-emitting surface 123 of the light-emitting component 120. Therefore, n can be 0.2, 0.15, 0.1, 0.08, or 0.05, etc., which is only needed to be greater than or equal to 0 and less than or equal to 0.2.

In practical applications, the value of n can be set according to the distance between the bottom surface of the recess 150 and the light-emitting surface 123 of the light-emitting component 120, and the value of n is not limited herein.

In another embodiments, if there is no encapsulation layer 13 and the touch control layer 14 between the flat layer 15 and the light-emitting component layer 12, n can be 0, i.e., the size of the bottom surface 151 of the recess 150 can be equal to the size of the light-emitting surface 123 of the light-emitting component 120.

Further, a mass ratio of the refractive particles 161 in the material of the lens layer 16 is greater than or equal to 1% and less than or equal to 40%. The mass ratio of the refractive particles 161 in the material of the lens layer 16 can specifically be 1%, 10%, 20%, 30%, or 40%, etc.

It should be noted that the mass ratio of the refractive particles 161 in the material of the lens layer 16 is related to the refractive index of the lens layer 16. The greater the mass ratio of the refractive particles 161 is, the greater the refractive index of the lens layer 16 is. If the mass ratio of the refractive particles 161 is less than 1% or greater than 40%, it will make the refractive index of the lens layer 16 too small or too large, which will lead to a decrease in efficiency of light emission of the display panel.

In one embodiment, as shown in FIG. 1 and FIG. 2, the display panel further includes a polarizer 17. The polarizer 17 is disposed on a side of the lens layer 16 away from the light-emitting component layer 12.

In specific, the polarizer 17 includes an adhesive layer 171, a polarizing layer 172, and a protective layer 173 sequentially stacked. The polarizing layer 172 is adhered to a surface of the side of the lens layer 16 away from the light-emitting component layer 12 through the adhesive layer 171. The adhesive layer 171 can be pressure-sensitive adhesive or optical adhesive.

Figure 4:
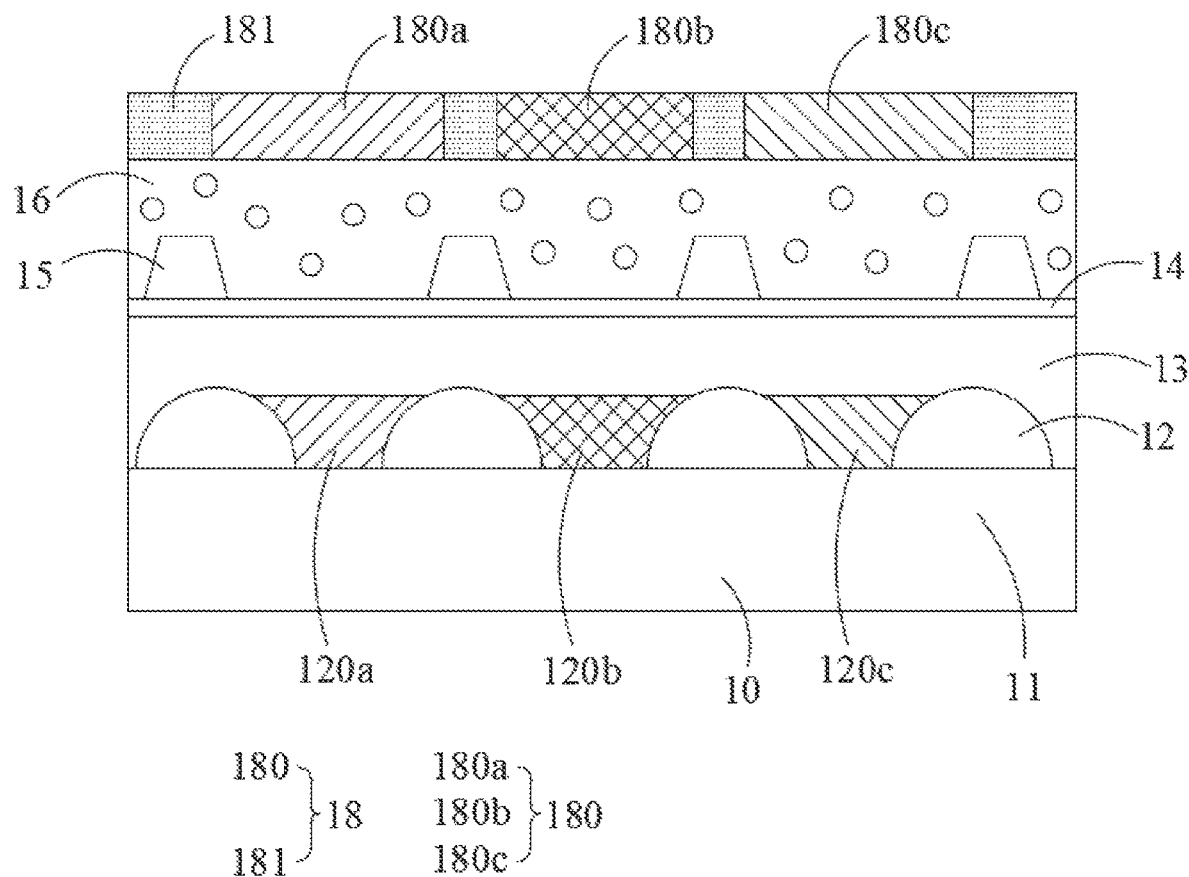
FIG. 4 is a schematic diagram of the structure of a third type of display panel provided in an embodiment of the present application.

As shown in FIG. 4. FIG. 4 is a schematic diagram of the structure of a third type of display panel provided in an embodiment of the present application. The structure of the third type of display panel shown in FIG. 4 is substantially similar to the structure of the second type of display panel shown in FIG. 2. What is different is that there is no polarizer set in the third type of display panel shown in FIG. 4, and a polarizer-less (Pol-Less) structure is utilized.

In specific, as shown in FIG. 4, the display panel further includes a color filter layer 18. The color filter layer 16 is disposed on the side of the lens layer 16 away from the light-emitting component layer 12.

The color filter layer 18 includes a plurality of filter units 180. The filter units 180 are disposed the light emission side of the light-emitting components 120 and aligned with the light-emitting components 120.

In specific, the filter units 180 include red filter units 180a, green filter units 180b, and blue filter units 180c. The red filter units 180a are aligned with the red organic light-emitting diodes 120a. The green filter units 180b are aligned with the green organic light-emitting diodes 120b. The blue filter units 180c are aligned with the blue organic light-emitting diodes 120c.

The color filter layer 18 further includes a plurality of black matrices 181. The plurality of black matrices 181 are spaced apart from each other. The filter unit 180 is disposed between the adjacent black matrices 181. The filter units 180 can be aligned with the recesses 150. A size of the filter unit 180 can be equal to a size of the recess 150 or greater than the size of the recess 150, so as to reduce the black matrices 181 to block the emitted light, and thus can further improve efficiency of light emission of the display panel.

Figure 5:
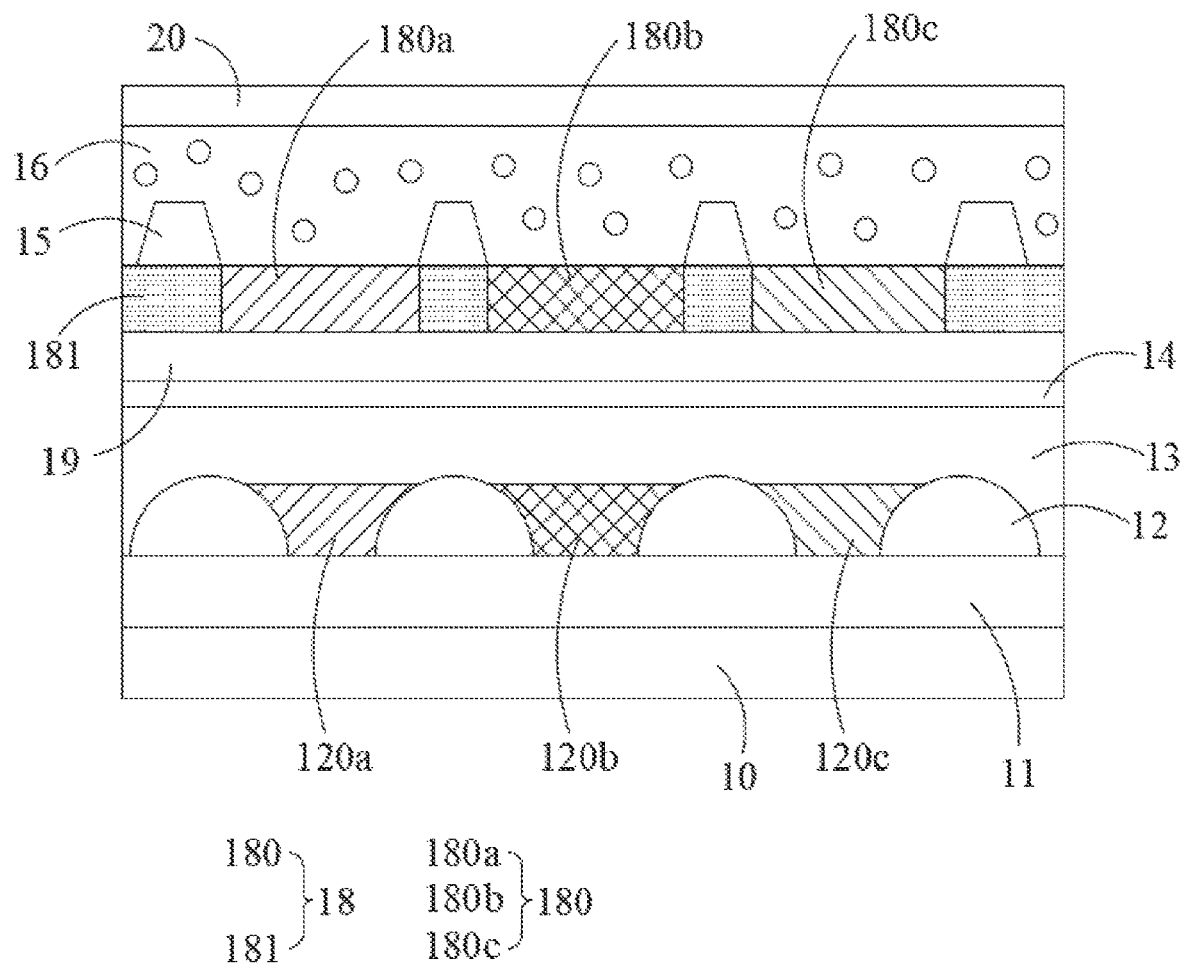
FIG. 5 is a schematic diagram of the structure of a fourth type of display panel provided in an embodiment of the present application.

In one embodiment, as shown in FIG. 5, which is a schematic diagram of the structure of a fourth type of display panel provided in an embodiment of the present application. The structure of the fourth type of display panel shown in FIG. 5 is substantially similar to the structure of the third type of display panel shown in FIG. 4. What is different is that the color filter layer 18 of the fourth type of display panel shown in FIG. 5 is disposed between the light-emitting component layer 12 and the lens layer 16.

In embodiments of the present application, the display panel further includes a second flat layer 19. The second flat layer 19 is disposed between the color filter layer 18 and the touch control layer 14 so as to enhance flatness of the color filter layer 18.

The display panel further includes a protective cover 20. The protective cover 20 is disposed on a side of the lens layer 16 away from the color filter layer 18 so as to protect the lens layer 16 and other film layers, thereby avoiding being worn during production or use.

In the fourth type of display panel shown in FIG. 5, since the flat layer 15 is directly formed above the color filter layer 18, a size of the filter unit 180 in the color filter layer 18 can be equal to a size of the bottom surface 151 of the recess 150 in the flat layer 15, which prevents the black matrices 181 in the color filter layer 18 from blocking the light emitted to the recesses 150.

As shown in FIG. 6a to FIG. 6d. FIG. 6a to FIG. 6d are schematic diagrams of the flow of a first type of manufacturing method of display panel provided in an embodiment of the present application. The manufacturing method of the display panel is used for preparation of forming the display panel in the above-mentioned embodiments shown in FIG. 2. The manufacturing method of the display panel includes:
- a step S10 of forming a light-emitting component layer 12 on a side of a base substrate 10;
- a step S20 of forming a flat layer 15 on a light emission side of the light-emitting component layer 12;
- a step S30 of forming a plurality of recesses 150 arranged at intervals on the flat layer 15;
- a step S40 of forming a lens layer 16 on the flat layer 15. The lens layer 16 has a plurality of lens units 160, and the lens units 160 are at least disposed in the recesses 150.

Figure 6A:
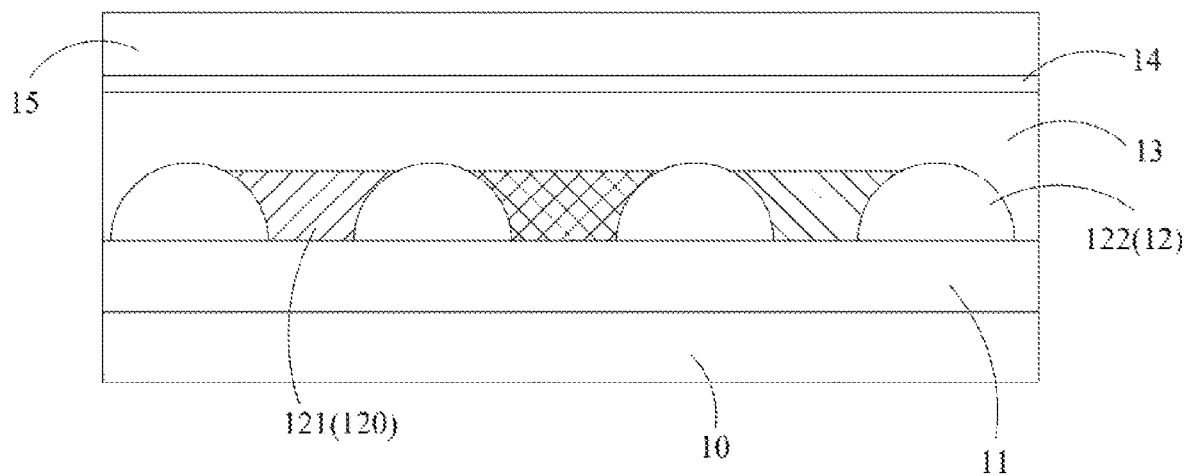
FIG. 6a to FIG. 6d are schematic diagrams of the flow of a first type of manufacturing method of display panel provided in an embodiment of the present application.

As shown in FIG. 6a, in the step S10, the light-emitting component layer 12 is disposed on a side of the base substrate 10. Before preparing to form the light-emitting component layer 12, a thin film transistor array layer 11 should also be formed on the base substrate 10.

The thin film transistor array layer 11 has a plurality of pixel driving circuits distributed in an array and data lines and scan lines used for connecting the pixel driving circuits. The pixel driving circuits are consisted of a plurality of thin film transistors and capacitors.

The light-emitting component layer 12 includes a pixel definition layer 122. The pixel definition layer 122 is disposed on a side of the thin film transistor array layer 11 away from the base substrate 10. A plurality of pixel openings are defined by the pixel definition layer 122. The pixel openings penetrate through the pixel definition layer 122 in a thickness direction of the pixel definition layer 122.

The light-emitting component layer 12 also includes a plurality of light-emitting components 120. The light-emitting components 120 are electrically connected with the pixel driving circuits, thereby emitting light under control and driving of the pixel driving circuits. The light-emitting components 120 include a light-emitting layer 121. The light-emitting layer 121 is disposed in the pixel openings.

In embodiments of the present application, as shown in FIG. 6a, before forming the flat layer 15 on the light emission side of the light-emitting component layer 12, an encapsulation layer 13 and a touch control layer 14 should also be formed on the light emission side of the light-emitting component layer 12.

The encapsulation layer 13 can be prepared and formed by a thin-film encapsulation (TFE) process. The encapsulation layer 13 can include a first inorganic encapsulation layer, an organic encapsulation layer, and a second inorganic encapsulation layer sequentially stacked on the light emission side of the light-emitting component layer 12.

The materials of the first inorganic encapsulation layer and the second inorganic layer can include at least one or more inorganic materials such as silicon nitride, silicon oxide, and silicon oxynitride with better hydrophobicity. The materials of the organic encapsulation layer can include at least one or more materials such as epoxy resin or acrylic-based materials.

In the step S20, the refractive index of the flat layer 15 is greater than or equal to 1.1 and less than or equal to 1.4. The refractive index of the flat layer 15 can specifically be 1.1, 1.2, 1.3, or 1.4, etc. A thickness of the flat layer 15 is greater than or equal to 1 μm and less than or equal to 5 μm. The thickness of the flat layer 15 can specifically be 1 μm, 2 μm, 4 μm, or 5 μm, etc.

Figure 6B:
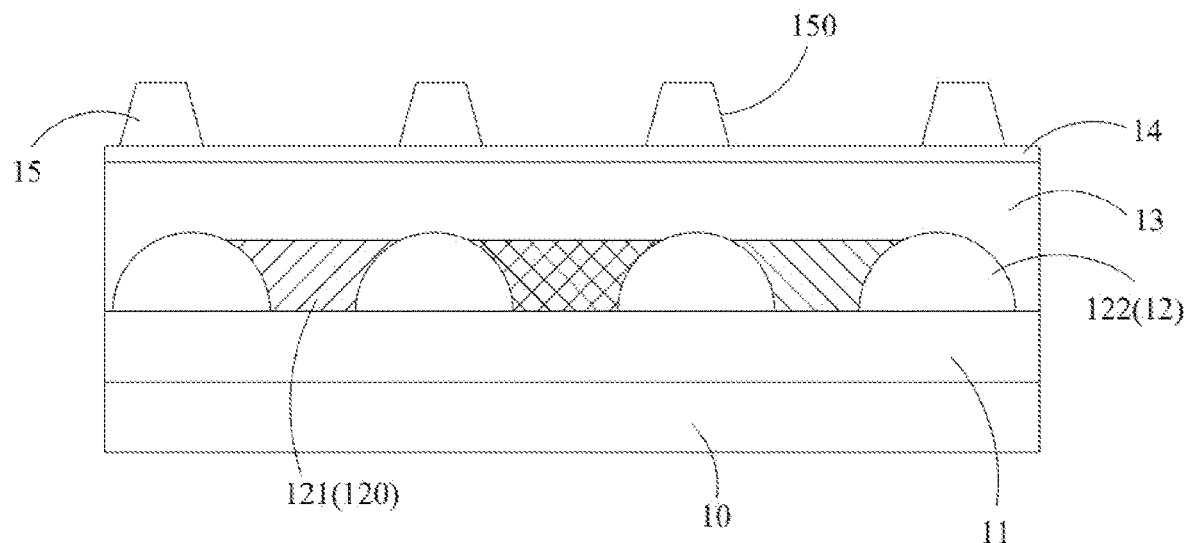

As shown in FIG. 6b, in the step S30, the flat layer 15 is disposed on a side of the touch control layer 14 away from the encapsulation layer 13. A plurality of recesses 150 arranged at intervals are defined by the flat layer 15. The recesses 150 penetrate through the flat layer 15 in a thickness direction of the flat layer 15. The recesses 150 and the light-emitting components 120 are one-to-one aligned with each other, so that light emitted by the light-emitting components 120 can be emitted through the recesses 150.

In embodiments of the present application, the recesses 150 are inverted trapezoids in a cross-section perpendicular to the flat layer 15. In practical applications, the shape of the recesses 150 in the cross-section perpendicular to the flat layer 15 is not limited to an inverted trapezoid in the above-mentioned embodiments but can also include but not limited to any one of trapezoids, rectangles, semi-circles, semi-ellipses, and other irregular shapes.

Figure 6C:
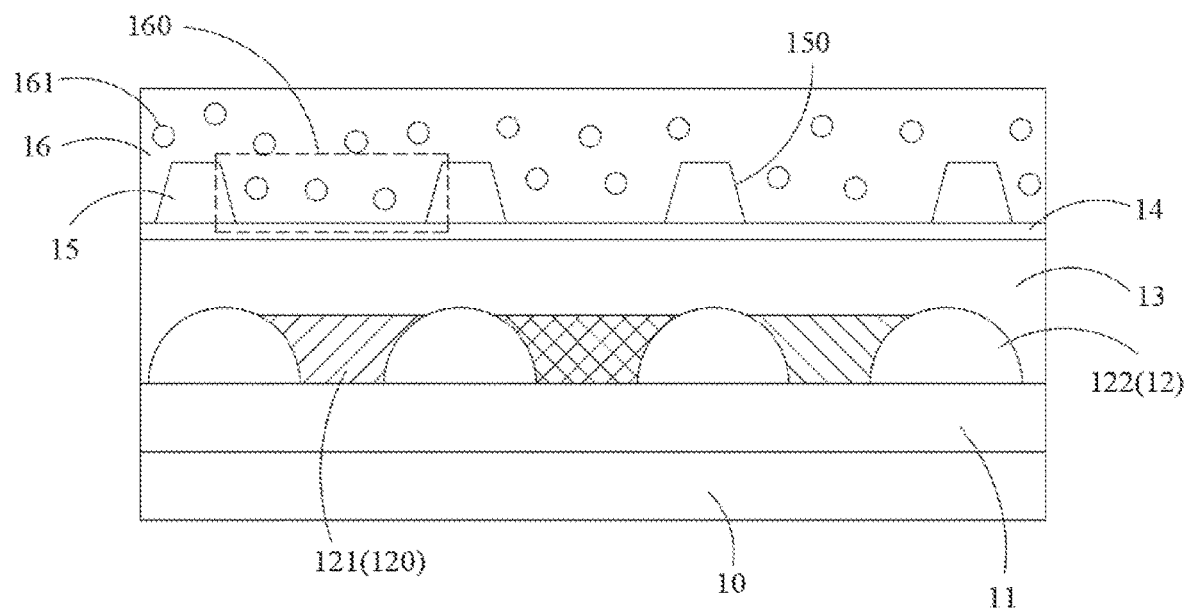

As shown in FIG. 6c, in the step S40, the materials of the lens layer 16 are respectively filled within each of the recesses 150 so as to form a plurality of lens units 160 arranged at intervals. The lens units 160 are in shape of prisms. The lens layer 16 also covers a side of the flat layer 15 away from the light-emitting component layer 12.

In embodiments of the present application, material of the lens layer 16 includes optical adhesive and refractive particles 161 distributed in the optical adhesive. A refractive index of the refractive particles 161 is greater than a refractive index of the optical adhesive. Through adding refractive particles into optical adhesive, the refractive index of the optical adhesive can be increased, such that the refractive index of the lens layer 16 can be greater than the refractive index of the flat layer 15.

Further, the refractive index of the optical adhesive can be greater than or equal to 1.4 and less than or equal to 1.7. The refractive index of the refractive particles 161 is greater than 1.8. The refractive index of the lens layer 16 formed by mixing the refractive particles 161 with the optical adhesive is greater than or equal to 1.5 and less than or equal to 2. The refractive index of the lens layer 16 can specifically be 1.5, 1.7, 1.9, or 2, etc.

In embodiments of the present application, the refractive particles 161 can be zirconia particles. In practical applications, the material of the refractive particles is not limited to the zirconia in the above-mentioned embodiment but can also include but not limited to particles formed by the preparation of at least one or more of nanoscale organic silicone materials, $SiN_x$, $Si_3N_4$, $TiO_2$, MgO, ZnO, $SnO_2$, $Al_2O_3$, and $CaF_2$.

In embodiments of the present application, particle sizes of the refractive particles 161 should be greater than or equal to 5 nm and less than or equal to 50 nm. The particle sizes of the refractive particles can specifically be 5 nm, 10 nm, 30 nm, 45 nm, or 50 nm, etc. The particle sizes of the refractive particles 161 should be less than the thickness of the lens layer 16, so that the refractive particles 161 can be uniformly distributed over the lens layer 16.

Figure 6D:
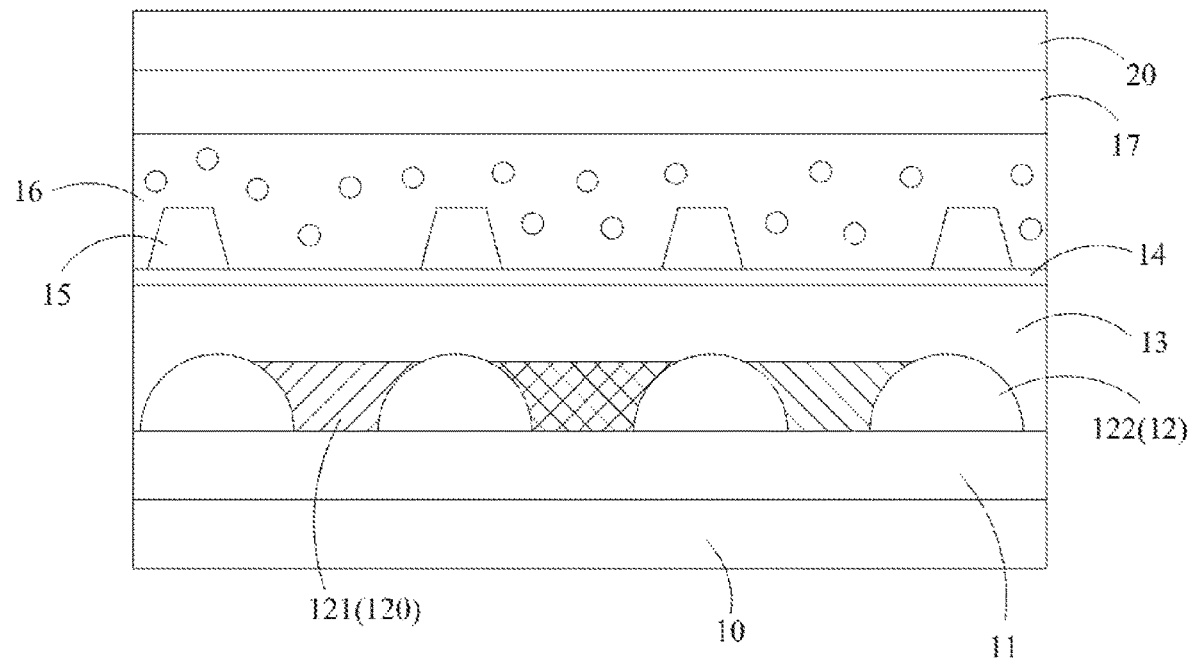

As shown in FIG. 6d, the manufacturing method of the display panel further includes:
a step S50 of forming a polarizer 17 and a protective cover 20 on a side of the lens layer 16 away from the light-emitting component layer 12.

In the step S50, the polarizer 17 includes an adhesive layer, a polarizing layer, and a protective layer sequentially stacked. The polarizing layer is adhered to a surface of the side of the lens layer 16 away from the light-emitting component layer 12 through the adhesive layer. The adhesive layer can be pressure-sensitive adhesive or optical adhesive. The protective cover 20 is disposed on a side of the polarizer 17 away from the lens layer 16.

Figure 7A:
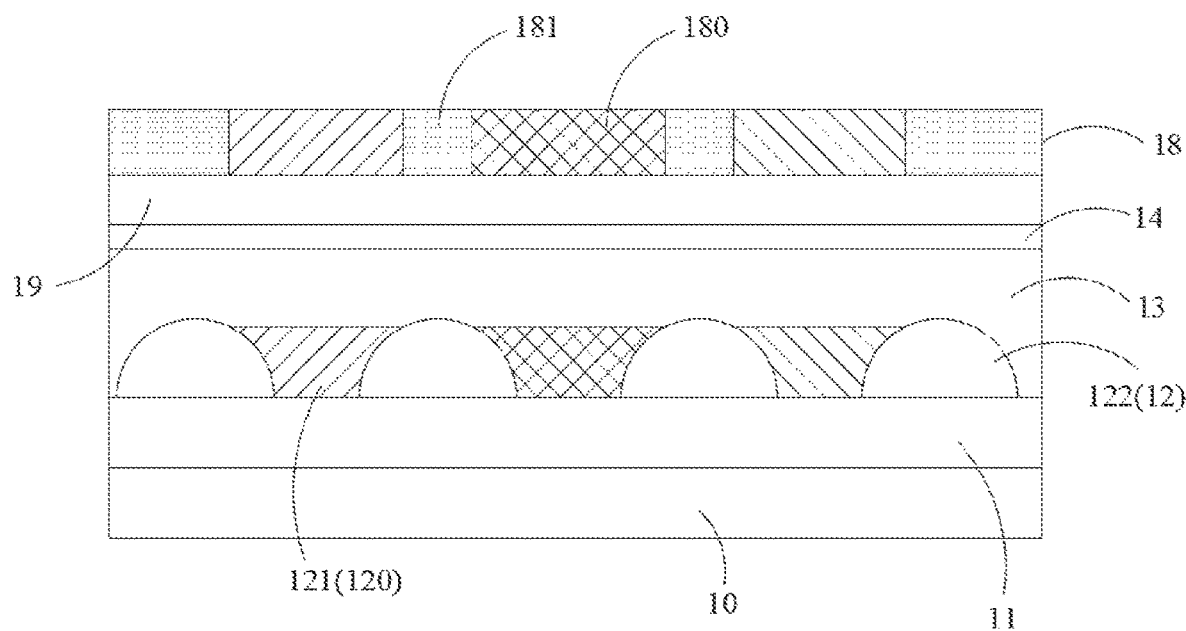
FIG. 7a to FIG. 7c are schematic diagrams of the flow of a second type of manufacturing method of display panel provided in an embodiment of the present application.
Figure 7B:
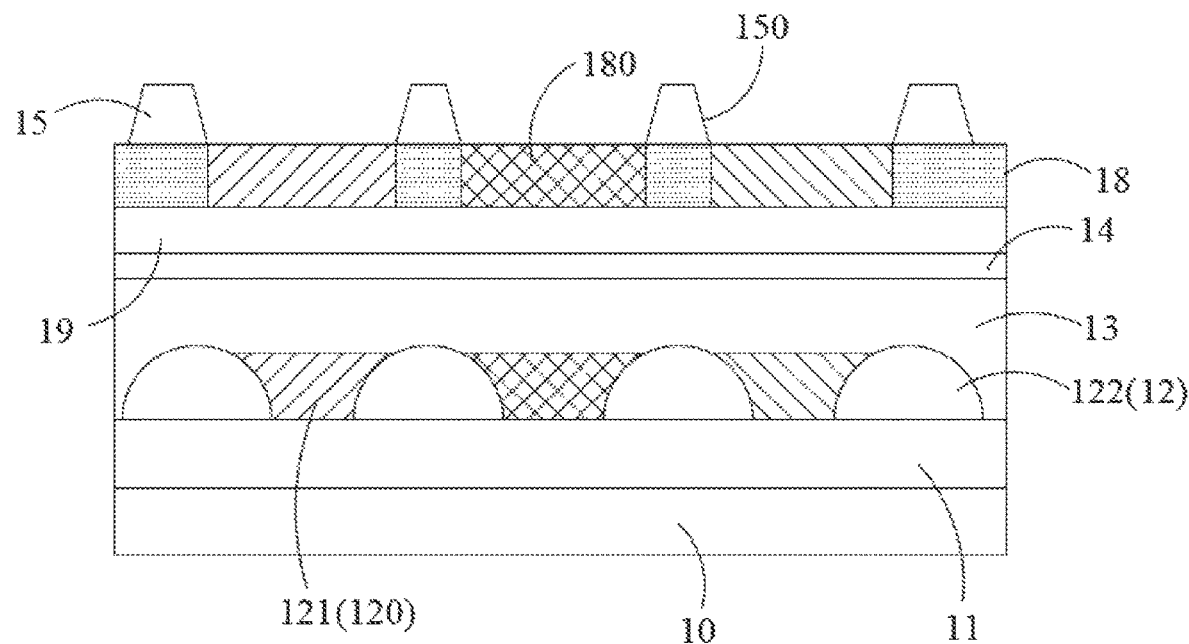
Figure 7C:
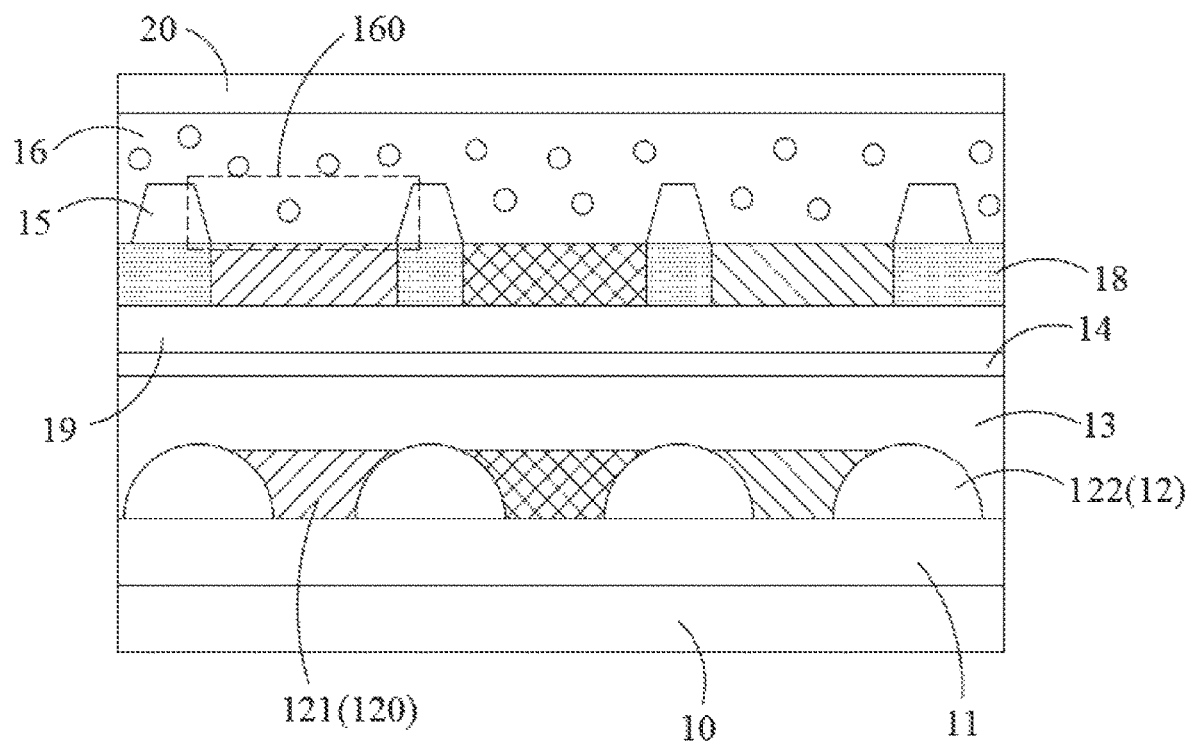

As shown in FIG. 7a to FIG. 7c. FIG. 7a to FIG. 7c are schematic diagrams of the flow of a second type of manufacturing method of display panel provided in an embodiment of the present application. The manufacturing method of the display panel is used for preparing to form the display panel in the above-mentioned embodiments shown in FIG. 5. The manufacturing method of the display panel includes:
a step S10 of forming a light-emitting component layer 12 on a side of a base substrate 10;
a step S20 of forming a flat layer 15 on a light emission side of the light-emitting component layer 12;
a step S30 of forming a plurality of recesses 150 arranged at intervals on the flat layer 15;
a step S40 of forming a lens layer 16 on the flat layer 15. The lens layer 16 has a plurality of lens units 160, and the lens units 160 are at least disposed in the recesses 150.

As shown in FIG. 7a, in the step S10, the light-emitting component layer 12 is disposed on a side of the base substrate 10. Before preparing to form the light-emitting component layer 12, a thin film transistor array layer 11 should also be formed on the base substrate 10.

The thin film transistor array layer 11 has a plurality of pixel driving circuits distributed in an array and data lines and scan lines used for connecting the pixel driving circuits. The pixel driving circuits are consisted of a plurality of thin film transistors and capacitors.

The light-emitting component layer 12 includes a pixel definition layer 122. The pixel definition layer 122 is disposed on a side of the thin film transistor array layer 11 away from the base substrate 10. A plurality of pixel openings are defined by the pixel definition layer 122. The pixel openings penetrate through the pixel definition layer 122 in a thickness direction of the pixel definition layer 122.

The light-emitting component layer 12 also includes a plurality of light-emitting components 120. The light-emitting components 120 are electrically connected with the pixel driving circuits, thereby emitting light under control and driving of the pixel driving circuits. The light-emitting components 120 include a light-emitting layer 121. The light-emitting layer 121 is disposed in the pixel openings.

In embodiments of the present application, as shown in FIG. 7a, before forming the flat layer 15 on the light emission side of the light-emitting component layer 12, an encapsulation layer 13 and a touch control layer 14 should also be formed on the light emission side of the light-emitting component layer 12.

The encapsulation layer 13 can be prepared and formed by a thin-film encapsulation (TFE) process. The encapsulation layer 13 can include a first inorganic encapsulation layer, an organic encapsulation layer, and a second inorganic encapsulation layer sequentially stacked on the light emission side of the light-emitting component layer 12.

The materials of the first inorganic encapsulation layer and the second inorganic layer can include at least one or more inorganic materials such as silicon nitride, silicon oxide, and silicon oxynitride with better hydrophobicity. The materials of the organic encapsulation layer can include at least one or more materials such as epoxy resin or acrylic-based materials.

The step S10 should also include forming a second flat layer 19 on a side of the touch control layer 14 away from the encapsulation layer 13 and then forming a color filter layer 18 on a side of the second flat layer 19 away from the touch control layer 14.

The color filter layer 18 includes a plurality of filter units 180 arranged at intervals and a plurality of black matrices arranged between the adjacent filter units 180. The filter units 180 include red filter units, green filter units, and blue filter units. The red filter units are aligned with the red organic light-emitting diodes in the light-emitting component layer 12. The green filter units are aligned with the green organic light-emitting diodes in the light-emitting component layer 12. The blue filter units are aligned with the blue organic light-emitting diodes in the light-emitting component layer 12.

As shown in FIG. 7b, in the step S30, the flat layer 15 is disposed on a side of the color filter layer 18 away from the second flat layer 19. A plurality of recesses 150 arranged at intervals are defined by the flat layer 15. The recesses 150 penetrate through the flat layer 15 in a thickness direction of the flat layer 15 so as to expose the filter units 180 located at the bottom of the flat layer 15. The recesses 150 with the filter units 180 are one-to-one aligned with the light-emitting components 120, so that light emitted by the light-emitting components 120 can be emitted through the recesses 150.

In embodiments of the present application, the recesses 150 are inverted trapezoids in a cross-section perpendicular to the flat layer 15. In practical applications, the shape of the recesses 150 in the cross-section perpendicular to the flat layer 15 is not limited to an inverted trapezoid in the above-mentioned embodiments but can also include but not limited to any one of trapezoids, rectangles, semi-circles, semi-ellipses, and other irregular shapes.

As shown in FIG. 7c, in the step S40, the materials of the lens layer 16 are respectively filled within each of the recesses 150 so as to form a plurality of lens units 160 arranged at intervals. The lens units 160 are in shape of prisms. The lens layer 16 also covers a side of the flat layer 15 away from the light-emitting component layer 12.

In embodiments of the present application, material of the lens layer 16 includes optical adhesive and refractive particles 161 distributed over the optical adhesive. A refractive index of the refractive particles 161 is greater than a refractive index of the optical adhesive. Through adding refractive particles into optical adhesive, the refractive index of the optical adhesive can be increased, such that the refractive index of the lens layer 16 can be greater than the refractive index of the flat layer 15.

Further, the refractive index of the optical adhesive can be greater than or equal to 1.4 and less than or equal to 1.7. The refractive index of the refractive particles 161 is greater than 1.8. The refractive index of the lens layer 16 formed by mixing the refractive particles 161 with the optical adhesive is greater than or equal to 1.5 and less than or equal to 2. The refractive index of the lens layer 16 can specifically be 1.5, 1.7, 1.9, or 2, etc.

In embodiments of the present application, the refractive particles 161 can be zirconia particles. In practical applications, the material of the refractive particles is not limited to the zirconia in the above-mentioned embodiment but can also include but not limited to particles formed by the preparation of at least one or more of nanoscale organic silicone materials, $SiN_x$, $Si_3N_4$, $TiO_2$, MgO, ZnO, $SnO_2$, $Al_2O_3$, and $CaF_2$.

In embodiments of the present application, particle sizes of the refractive particles 161 should be greater than or equal to 5 nm and less than or equal to 50 nm. The particle sizes of the refractive particles can specifically be 5 nm, 10 nm, 30 nm, 45 nm, or 50 nm, etc. The particle sizes of the refractive particles 161 should be less than the thickness of the lens layer 16, so that the refractive particles 161 can be evenly distributed in the lens layer 16.

As shown in FIG. 7c, the manufacturing method of the display panel further includes:

a step S50 of forming a protective cover 20 on a side of the lens layer 16 away from the light-emitting component layer 12. The protective cover 20 can be a glass cover. The protective cover 20 can be adhered to a surface of the side of the lens layer 16 away from the light-emitting component layer 12 through the optical adhesive.

The embodiments of the present application provide a display panel and an electronic device. The electronic device includes the display panel. The display panel includes a light-emitting component layer, a flat layer, and a lens layer. The light-emitting component layer has a plurality of light-emitting components. The flat layer is disposed on a light emission side of the light-emitting component layer. A plurality of recesses aligned with the light-emitting components are defined by the flat layer. The recesses penetrate through the flat layer in a thickness direction of the flat layer. The lens layer has a plurality of lens units. The lens units are disposed in the recesses. A refractive index of the lens layer is greater than a refractive index of the flat layer. As a result, a refractive index difference between the lens layer and the flat layer and refractive effect of the lens units on the light are used to reduce angles of light emission, such that light at large angles converges and transmits toward a center, thereby improving efficiency of forward light emission of the display panel.

Form the above discussion, although the preferred embodiments of the present application are disclosed as above, the preferred embodiments mentioned above are not intended to limit the present application. Those of ordinarily skilled in the art can make various changes and modification without departing from the spirit and scope of the present application. Therefore, the claimed scope of the present application is based on the scope defined by the claims.

What is claimed is:

1. A display panel, comprising:
   a light-emitting component layer having a plurality of light-emitting components;
   a flat layer disposed on a light emission side of the light-emitting component layer, wherein a plurality of recesses aligned with the light-emitting components are defined by the flat layer, and the recesses penetrate through the flat layer in a thickness direction of the flat layer; and
   a lens layer having a plurality of lens units, wherein the lens units are disposed in the recesses,
   wherein a refractive index of the lens layer is greater than a refractive index of the flat layer; the lens layer fills the recesses and covers a side of the flat layer away from the light-emitting component layer, a thickness of the flat layer is greater than or equal to 1 μm and less than or equal to 5 μm, and a thickness of the lens layer is greater than or equal to 10 μm and less than or equal to 50 μm.

2. The display panel as claimed in claim 1, wherein material of the lens layer comprises optical adhesive and refractive particles distributed over the optical adhesive.

3. The display panel as claimed in claim 2, wherein the refractive index of the flat layer is greater than or equal to 1.1 and less than or equal to 1.4, and the refractive index of the lens layer is greater than or equal to 1.5 and less than or equal to 2.

4. The display panel as claimed in claim 2, wherein a mass ratio of the refractive particles in the material of the lens layer is greater than or equal to 1% and less than or equal to 40%.

5. The display panel as claimed in claim 1, wherein the recess is defined by a bottom surface flatly disposed and a sidewall inclinedly disposed, and an angle between the sidewall and a plane where the bottom surface locates is greater than or equal to 30° and less than or equal to 75°.

6. The display panel as claimed in claim 5, wherein an orthographic projection of the bottom surface of the recess projected in a thickness direction of the display panel covers an orthographic projection of a light-emitting surface of the light-emitting component projected in the thickness direction of the display panel.

7. The display panel as claimed in claim 6, wherein a distance between the bottom surface of the recess and the light-emitting surface of corresponding one of the light-emitting components is h;
   a minimum distance between an outer edge of the orthographic projection of the bottom surface of the recess projected in the thickness direction of the display panel and an outer edge of the light-emitting surface of the light-emitting component in the thickness direction of the display panel is b;
   wherein b=h*n, and n is greater than or equal to 0 and less than or equal to 0.2.

8. The display panel as claimed in claim 1, further comprising:

an encapsulation layer disposed on the light emission side of the light-emitting component layer and covering the light-emitting component layer; and a touch control layer disposed on a side of the encapsulation layer away from the light-emitting component layer, wherein the flat layer is disposed on a side of the touch control layer away from the light-emitting component layer.

9. The display panel as claimed in claim 1, further comprising:

a color filter layer disposed on a side of the lens layer away from the light-emitting component layer, wherein the color filter layer comprises a plurality of filter units disposed the light emission side of the light-emitting components and aligned with the light-emitting components.

10. The display panel as claimed in claim 1, further comprising:

a color filter layer disposed between the light-emitting component layer and the lens layer, wherein the color filter layer comprises a plurality of filter units disposed the light emission side of the light-emitting components and aligned with the light-emitting components.

11. An electronic device comprising a display panel, wherein the display panel comprises:

a light-emitting component layer having a plurality of light-emitting components;

a flat layer disposed on a light emission side of the light-emitting component layer, wherein a plurality of recesses aligned with the light-emitting components are defined by the flat layer, and the recesses penetrate through the flat layer in a thickness direction of the flat layer; and a lens layer having a plurality of lens units, wherein the lens units are disposed in the recesses, wherein a refractive index of the lens layer is greater than a refractive index of the flat layer; the lens layer fills the recesses and covers a side of the flat layer away from the light-emitting component layer, a thickness of the flat layer is greater than or equal to 1 μm and less than or equal to 5 μm, and a thickness of the lens layer is greater than or equal to 10 μm and less than or equal to 50 μm.

12. The electronic device as claimed in claim 11, wherein material of the lens layer comprises optical adhesive and refractive particles distributed over the optical adhesive.

13. The electronic device as claimed in claim 12, wherein the refractive index of the flat layer is greater than or equal to 1.1 and less than or equal to 1.4, and the refractive index of the lens layer is greater than or equal to 1.5 and less than or equal to 2.

14. The electronic device as claimed in claim 12, wherein a mass ratio of the refractive particles in the material of the lens layer is greater than or equal to 1% and less than or equal to 40%.

15. The electronic device as claimed in claim 11, wherein the recess is defined by a bottom surface flatly disposed and a sidewall inclinedly disposed, and an angle between the sidewall and a plane where the bottom surface locates is greater than or equal to 30° and less than or equal to 75°.

16. The electronic device as claimed in claim 15, wherein an orthographic projection of the bottom surface of the recess projected in a thickness direction of the display panel covers an orthographic projection of a light-emitting surface of the light-emitting component projected in the thickness direction of the display panel.

17. The electronic device as claimed in claim 16, wherein a distance between the bottom surface of the recess and the light-emitting surface of corresponding one of the light-emitting components is h;

a minimum distance between an outer edge of the orthographic projection of the bottom surface of the recess projected in the thickness direction of the display panel and an outer edge of the light-emitting surface of the light-emitting component in the thickness direction of the display panel is b;

wherein b=h*n, and n is greater than or equal to 0 and less than or equal to 0.2.

18. The electronic device as claimed in claim 11, wherein the display panel further comprises:

an encapsulation layer disposed on the light emission side of the light-emitting component layer and covering the light-emitting component layer; and a touch control layer disposed on a side of the encapsulation layer away from the light-emitting component layer, wherein the flat layer is disposed on a side of the touch control layer away from the light-emitting component layer.

19. The electronic device as claimed in claim 11, wherein the display panel further comprises:

a color filter layer disposed on a side of the lens layer away from the light-emitting component layer, wherein the color filter layer comprises a plurality of filter units disposed the light emission side of the light-emitting components and aligned with the light-emitting components.

20. The electronic device as claimed in claim 11, wherein the display panel further comprises:

a color filter layer disposed between the light-emitting component layer and the lens layer, wherein the color filter layer comprises a plurality of filter units disposed the light emission side of the light-emitting components and aligned with the light-emitting components.

* * * * *